US012604562B2

(12) United States Patent
Cheng et al.

(10) Patent No.: US 12,604,562 B2
(45) Date of Patent: Apr. 14, 2026

(54) SEMICONDUCTOR STRUCTURE AND MANUFACTURE METHOD THEREFOR

(71) Applicant: ENKRIS SEMICONDUCTOR, INC., Suzhou (CN)

(72) Inventors: Kai Cheng, Suzhou (CN); Weihua Liu, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 694 days.

(21) Appl. No.: 18/004,340

(22) PCT Filed: Sep. 24, 2020

(86) PCT No.: PCT/CN2020/117531
§ 371 (c)(1),
(2) Date: Jan. 5, 2023

(87) PCT Pub. No.: WO2022/061669
PCT Pub. Date: Mar. 31, 2022

(65) Prior Publication Data
US 2023/0282765 A1 Sep. 7, 2023

(51) Int. Cl.
*H10H 20/812* (2025.01)
*H10H 20/01* (2025.01)
(Continued)

(52) U.S. Cl.
CPC ...... *H10H 20/812* (2025.01); *H10H 20/0137* (2025.01); *H10H 20/815* (2025.01); *H10H 20/825* (2025.01)

(58) Field of Classification Search
CPC .................................................. H10H 20/812
See application file for complete search history.

(56) References Cited

U.S. PATENT DOCUMENTS

| | | | |
|---|---|---|---|
| 7,535,031 | B2 | 5/2009 | Kim et al. |
| 8,421,057 | B2 | 4/2013 | Yan et al. |

(Continued)

FOREIGN PATENT DOCUMENTS

| | | |
|---|---|---|
| CN | 101263615 A | 9/2008 |
| CN | 102299222 A | 12/2011 |

(Continued)

OTHER PUBLICATIONS

ISA State Intellectual Property Office of the People's Republic of China, International Search Report Issued in Application No. PCT/CN2020/117531, Jun. 17, 2021, WIPO, 4 pages.

(Continued)

*Primary Examiner* — Douglas M Menz
(74) *Attorney, Agent, or Firm* — BSJ & SUN LLC

(57) ABSTRACT

The present disclosure provides a semiconductor structure and a method for manufacturing the semiconductor structure. The semiconductor structure includes an N-type semiconductor layer provided on a substrate in a vertical direction, and at least one of multiple-quantum-well structure is formed on the N-type semiconductor layer in a horizontal direction, a P-type semiconductor layer is provided above the multiple-quantum-well structure and on at least part of sides of the multiple-quantum-well structure, each multiple-quantum-well structure includes a plurality of semiconductor layers sequentially stacked in the vertical direction and a multiple-quantum-well unit formed between each two adjacent semiconductor layers of the plurality of semiconductor layers, and the P-type semiconductor layer is in contact with each of the plurality of semiconductor layers of the multiple-quantum-well structure in the vertical direction. The method is used to manufacture the semiconductor structure.

18 Claims, 16 Drawing Sheets

(51) Int. Cl.
_H10H 20/815_ (2025.01)
_H10H 20/825_ (2025.01)

(56) References Cited

U.S. PATENT DOCUMENTS

| | | | |
|---|---|---|---|
| 9,236,548 | B2 | 1/2016 | Yan et al. |
| 9,257,599 | B2 | 2/2016 | Kim et al. |
| 10,355,453 | B2 * | 7/2019 | Hahn .................... H01S 5/0421 |
| 2007/0057249 | A1 | 3/2007 | Kim et al. |
| 2011/0142089 | A1 | 6/2011 | Kudo et al. |
| 2011/0315952 | A1 | 12/2011 | Yan et al. |
| 2013/0217166 | A1 | 8/2013 | Yan et al. |
| 2015/0060762 | A1 | 3/2015 | Kim et al. |
| 2019/0288486 | A1 | 9/2019 | Hahn et al. |
| 2020/0321391 | A1 * | 10/2020 | Danesh ................ H10H 29/142 |

FOREIGN PATENT DOCUMENTS

| | | |
|---|---|---|
| CN | 102332516 A | 1/2012 |
| CN | 102822995 A | 12/2012 |
| CN | 104425665 A | 3/2015 |
| EP | 2257997 A1 | 12/2010 |
| JP | H07193318 A | 7/1995 |
| JP | 2001223434 A | 8/2001 |
| WO | 2018012585 A1 | 1/2018 |

OTHER PUBLICATIONS

ISA State Intellectual Property Office of the People's Republic of China, Written Opinion of the International Searching Authority Issued in Application No. PCT/CN2020/117531, Jun. 17, 2021, WIPO, 6 pages.(Submitted with Machine/Partial Translation).
TW Patent Office, Office Action Issued in Application No. 110134791, Mar. 10, 2022, 13 pages.(Submitted with Machine/Partial Translation).
TW Patent Office, Decision of Rejection Issued in Application No. 110134791, Aug. 24, 2022, 4 pages.(Submitted with Machine/Partial Translation).
State Intellectual Property Office of the People's Republic of China, Office Action and Search Report Issued in Application No. 2020801049964, Apr. 16, 2025, 16 pages. (Submitted with Machine Translation).
Wang Fu-xue et al, "Growth of Single-chip Dual-wavelength White-light InGaN/GaN Multiple Quantum Wells by Using the Selective Epitaxial Growth Method", Acta Photonica Sinica, vol. 46 No. 3, Mar. 2017, 5 pages.

* cited by examiner

SEMICONDUCTOR STRUCTURE AND MANUFACTURE METHOD THEREFOR

CROSS REFERENCE TO RELATED APPLICATIONS

The present application is the U.S. national phase of PCT Application No. PCT/CN2020/117531 filed on Sep. 24, 2020, which is incorporated herein by reference in its entirety.

TECHNICAL FIELD

The present disclosure relates to the field of semiconductor technologies, and in particular, to a semiconductor structure and a method for manufacturing the semiconductor structure.

BACKGROUND

Conventional gallium nitride (GaN) based material light emitting diode (LED) is commonly used in various lighting products, such as indoor lighting. Conventional white LED lighting is formed by epitaxy of GaN-based LED epitaxial structures in the blue light band, i.e., using blue light to excite a specific phosphor to generate a white LED formed by mixing blue light and yellow light; similarly, a conventional LCD display uses a blue LED plus phosphor to form the white LED as backlight for display applications.

However, how to simplify the structure in order to directly manufacture the white LED is the current urgent problem in the field of the art.

SUMMARY

The present disclosure provides a semiconductor structure and a method for manufacturing the semiconductor structure, such that the injection method of the carriers provided by the P-type semiconductor layer is that the carriers are injected laterally into the active region (light emitting region) of each designed multiple-quantum-well structure, thereby a GaN-based LED structure material with multiple light emitting wavelengths is formed.

To this end, embodiments of the present disclosure provide a semiconductor structure, including:

a substrate;

an N-type semiconductor layer on the substrate;

a multiple-quantum-well structure on the N-type semiconductor layer, wherein the multiple-quantum-well structure includes a plurality of semiconductor layers sequentially stacked and a multiple-quantum-well unit formed between each two adjacent semiconductor layers of the plurality of semiconductor layers; and a P-type semiconductor layer on the multiple-quantum-well structure and on at least part of sides of the multiple-quantum-well structure, wherein the P-type semiconductor layer is in contact with each of the plurality of semiconductor layers of the multiple-quantum-well structure.

Optionally, the N-type semiconductor layer is provided with a groove penetrating through the N-type semiconductor layer, and a multiple-quantum-well structure is formed in the groove.

Optionally, the multiple-quantum-well structures is singular or plural in number, when the multiple-quantum-well structures is plural in number, a plurality of multiple-quantum-well structures are regularly or irregularly arranged along a horizontal direction.

Optionally, each of the plurality of semiconductor layers of the multiple-quantum-well structure has a different molar content of indium.

Optionally, for each of the plurality of semiconductor layers of the multiple-quantum-well structure, the semiconductor layer includes a first semiconductor sub-layer and a second semiconductor sub-layer periodically stacked, the multiple-quantum-well unit is between the first semiconductor sub-layer and the second semiconductor sub-layer, wherein the first semiconductor sub-layer includes indium.

Optionally, a molar content of indium in the first semiconductor sub-layers of the plurality of semiconductor layers increases sequentially along a direction of the N-type semiconductor layer pointing toward the P-type semiconductor layer.

Optionally, materials of the first semiconductor sub-layers of the plurality of semiconductor layers include InGaN, and materials of the second semiconductor sub-layers of the plurality of semiconductor layers include GaN;

a material of the N-type semiconductor layer includes a group III nitride;

a material of the P-type semiconductor layer includes a group III nitride.

Optionally, the semiconductor structure further includes:

an intrinsic semiconductor layer between the substrate and the N-type semiconductor layer.

Optionally, the semiconductor structure further includes:

a stress-release layer between the N-type semiconductor layer and the multiple-quantum-well structure.

Optionally, a material of the stress-release layer includes at least one of GaN or InGaN.

Optionally, the semiconductor structure further includes a dielectric layer between the N-type semiconductor layer and the P-type semiconductor layer, the dielectric layer is formed with a hollow out region, and the multiple-quantum-well structure is formed in the hollow out region.

Optionally, the sides of the multiple-quantum-well structure extend obliquely inward along the direction of the N-type semiconductor layer pointing toward the P-type semiconductor layer, and the sides are oblique or curved.

Optionally, each of the plurality of semiconductor layers of the multiple-quantum-well structure emits light at a different emission wavelength, wherein the semiconductor layer closest to the N-type semiconductor layer has the shortest emission wavelength, and the semiconductor layer farthest from the N-type semiconductor layer has the longest emission wavelength.

Optionally, a method for manufacturing a semiconductor structure includes:

S1: forming an N-type semiconductor layer on a substrate in a vertical direction to form an intermediate semiconductor structure;

S2: forming a multiple-quantum-well structure on the intermediate semiconductor structure, wherein the multiple-quantum-well structure includes a plurality of semiconductor layers sequentially stacked and a multiple-quantum-well unit formed between each two adjacent semiconductor layers of the plurality of semiconductor layers; and S3: forming a P-type semiconductor layer on the multiple-quantum-well structure and on at least part of sides of the multiple-quantum-well structure, wherein the P-type semiconductor layer is in contact with each of the plurality of semiconductor layers of the multiple-quantum-well structure in the vertical direction.

Optionally, the step S2 includes:

S21: forming a multiple-quantum-well layer on the intermediate semiconductor structure;

S22: forming a mask on the multiple-quantum-well layer;

S23: etching or corroding the multiple-quantum-well layer through the mask to form the multiple-quantum-well structure; and S24: removing the mask.

Optionally, the step S2 includes:

S21: forming a mask on the intermediate semiconductor structure;

S22: forming the multiple-quantum-well structure in a hollow out region of the mask; and S23: removing the mask.

Optionally, the step S2 includes:

S21: forming a dielectric layer and a mask stacked on the intermediate semiconductor structure;

S22: forming the multiple-quantum-well structure in a hollow out region of the mask and in a hollow out region of the dielectric layer, and the hollow out region of the mask is formed corresponding to the hollow out region of the dielectric layer; and S23: removing the mask.

Optionally, the step S2 includes:

S21: forming a groove on the intermediate semiconductor structure; and

S22: forming a multiple-quantum-well structure on the intermediate semiconductor structure and in the groove.

Optionally, the step S1 includes:

S11: forming an intrinsic semiconductor layer on the substrate;

S12: forming the N-type semiconductor layer on the intrinsic semiconductor layer; and S13: forming a stress-release layer on the N-type semiconductor layer to form the intermediate semiconductor structure.

Optionally, a depth of etching or corroding of the multiple-quantum-well layer in the step S23 is equal to or less than a thickness of the multiple-quantum-well layer.

In the semiconductor structure and manufacturing method therefor of the above embodiments, a multiple-quantum-well structure is provided, a P-type semiconductor layer is provided above the multiple-quantum-well structure and on at least part of sides of the multiple-quantum-well structure, and the P-type semiconductor layer is in contact with each semiconductor layer of the multiple-quantum-well structure in the vertical direction, such that the injection method of the carriers provided by the P-type semiconductor layer is that the carriers are injected laterally into the active region (light emitting region) of each designed multiple-quantum-well structure, and is different from the conventional method for injecting carriers along the vertical epitaxial material surface of the LED, thereby a GaN-based LED structure material with multiple light emitting wavelengths is formed.

The semiconductor structure of the present disclosure can be applied to the following aspects.

1. The white LED are achieved without phosphors or other color mixing methods.

2. The traditional LCD backlight is replaced, without adding phosphor, by directly encapsulating.

3. Full-color display and other applications are directly achieved with bandpass filters.

DETAILED DESCRIPTION OF THE EMBODIMENTS

Figure 1:
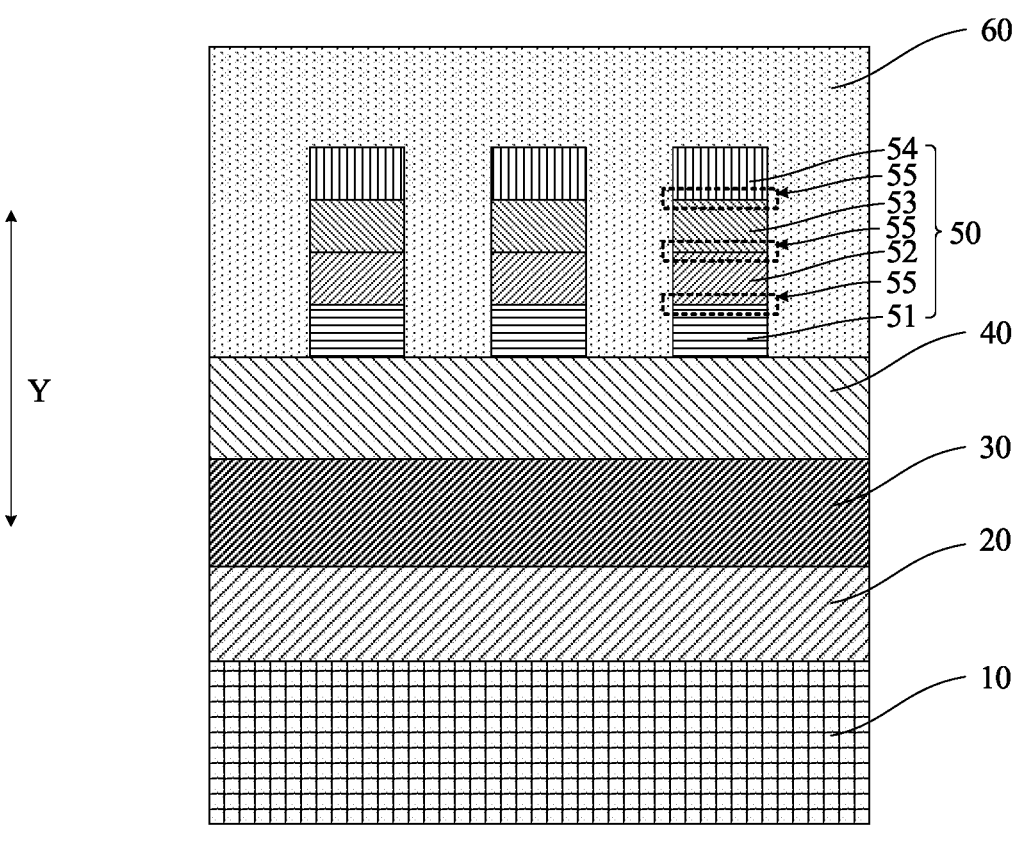
FIG. 1 is a schematic structural diagram illustrating a semiconductor structure according to an embodiment 1 of the present disclosure.

Examples will be described in detail herein, with the illustrations thereof represented in the drawings. Where the following description relates to the drawings, unless otherwise indicated, the same numerals in different drawings represent the same or similar elements. The embodiments described in the following exemplary embodiments do not represent all embodiments consistent with the present disclosure. Rather, they are merely examples of apparatuses and methods consistent with some aspects of the present disclosure as detailed in the appended claims.

The terminology used herein is for the purpose of describing particular embodiments only and is not intended to be limiting of the present disclosure. Unless otherwise defined, technical terms or scientific terms used in the present disclosure shall have the ordinary meaning as understood by persons having ordinary skill in the art to which the present disclosure belongs. The terms "a" or "an" and the like used in the specification and the claims of the present disclosure do not mean a quantity limit, but mean that there is at least one. Terms such as "include" or "comprise", and the like, are intended to mean that an element or object appearing before "include" or "comprise" covers an element or object appearing after "include" or "comprise" and its equivalents, and do not exclude other elements or objects. Terms such as "connect" or "couple", and the like, are not limited to physical or mechanical connections, but may include electrical connections, whether directly or indirectly. A term "a plurality of" includes two, and is equivalent to at least two. As used herein, the singular forms "a", "the" and "the" are intended to include the plural forms as well, unless the context clearly indicates otherwise. It should also be understood that as used herein, the term "and/or" is and includes any or all combinations of one or more of the associated listed items.

Embodiment 1

As shown in FIG. 1, this embodiment provides a semiconductor structure. The semiconductor structure includes a substrate 10, an N-type semiconductor layer 30, a plurality of multiple-quantum-well structures 50, and a P-type semiconductor layer 60. In this embodiment, the number of multiple-quantum-well structures 50 is three, but is not limited thereto, and may be set to two or other numbers according to design requirements.

The N-type semiconductor layer 30 is provided on the substrate 10 along a vertical direction Y.

The three multiple-quantum-well structures 50 are provided on the N-type semiconductor layer 30 spaced along a horizontal direction X. Each multiple-quantum-well structure 50 includes a plurality of semiconductor layers sequentially stacked along the vertical direction Y and a multiple-quantum-well unit 55 formed between each two adjacent semiconductor layers of the plurality of semiconductor layers.

Each of the plurality of the semiconductor layers has a different molar content of indium, i.e., each of the plurality of the semiconductor layers has a different component ratio of indium. In this embodiment, there is no limitation on how the component ratio of indium of each of the semiconductor layers may vary, and the molar content of indium of each of the semiconductor mays vary in increasing order, or in decreasing order, periodically, or irregularly, along a direction of the N-type semiconductor layer 30 pointing toward the P-type semiconductor layer 60.

Specifically, as shown in FIG. 1, the number of semiconductor layers is four, and the four semiconductor layers are noted in order along the vertical direction Y as a first semiconductor layer 51, a second semiconductor layer 52, a third semiconductor layer 53, and a fourth semiconductor layer 54, where the first semiconductor layer 51, the second semiconductor layer 52, the third semiconductor layer 53, and the fourth semiconductor layer 54 have different molar content of indium. However, without limitation, the number of semiconductor layers may be other values according to the design requirements. Multiple-quantum-well units 55 are provided between the first semiconductor layer 51 and the second semiconductor layer 52, between the second semiconductor layer 52 and the third semiconductor layer 53, and between the third semiconductor layer 53 and the fourth semiconductor layer 54, respectively.

The P-type semiconductor layer 60 is provided above each of the multiple-quantum-well structures 50, and on at least part of the sides of each of the multiple-quantum-well structures 50, and the P-type semiconductor layer 60 is in contact with each semiconductor layer of each of the multiple-quantum-well structures 50 along the vertical direction Y. In this embodiment, the P-type semiconductor layer 60 is disposed above each of the multiple-quantum-well structures 50, and around the sides of each of the multiple-quantum-well structures 50.

Thus, the plurality of multiple-quantum-well structures are provided, the P-type semiconductor layer 60 is provided above each of the multiple-quantum-well structures 50 and around the sides of each of the multiple-quantum-well structures 50, and the P-type semiconductor layer 60 is in contact with each semiconductor layer of each of the multiple-quantum-well structures 50 in the vertical direction, such that the injection method of the carriers provided by the P-type semiconductor layer 60 is that the carriers are injected laterally into the active region (light emitting region) of each designed multiple-quantum-well structure 50, and is different from the conventional method for injecting carriers along the vertical epitaxial material surface of the LED, thereby a GaN-based LED structure material with multiple light emitting wavelengths is formed.

A material of the N-type semiconductor layer 30 is a group III nitride; a material of the P-type semiconductor layer 60 is a group III nitride.

The semiconductor structure further includes, along the vertical direction Y, an intrinsic semiconductor layer 20 and a stress-release layer layer 40.

The intrinsic semiconductor layer 20 is disposed between the substrate 10 and the N-type semiconductor layer 30, and the intrinsic semiconductor layer 20 is used as a material buffer layer for improving the quality of the material. The stress-release layer 40 is disposed between the N-type semiconductor layer 30 and the multiple-quantum-well structure 50, and the stress-release layer 40 is used to release the built-in stresses in the material.

The material of the intrinsic semiconductor layer 20 is undoped GaN. The material of the stress-release layer 40 includes at least one of GaN or InGaN.

Figure 2:
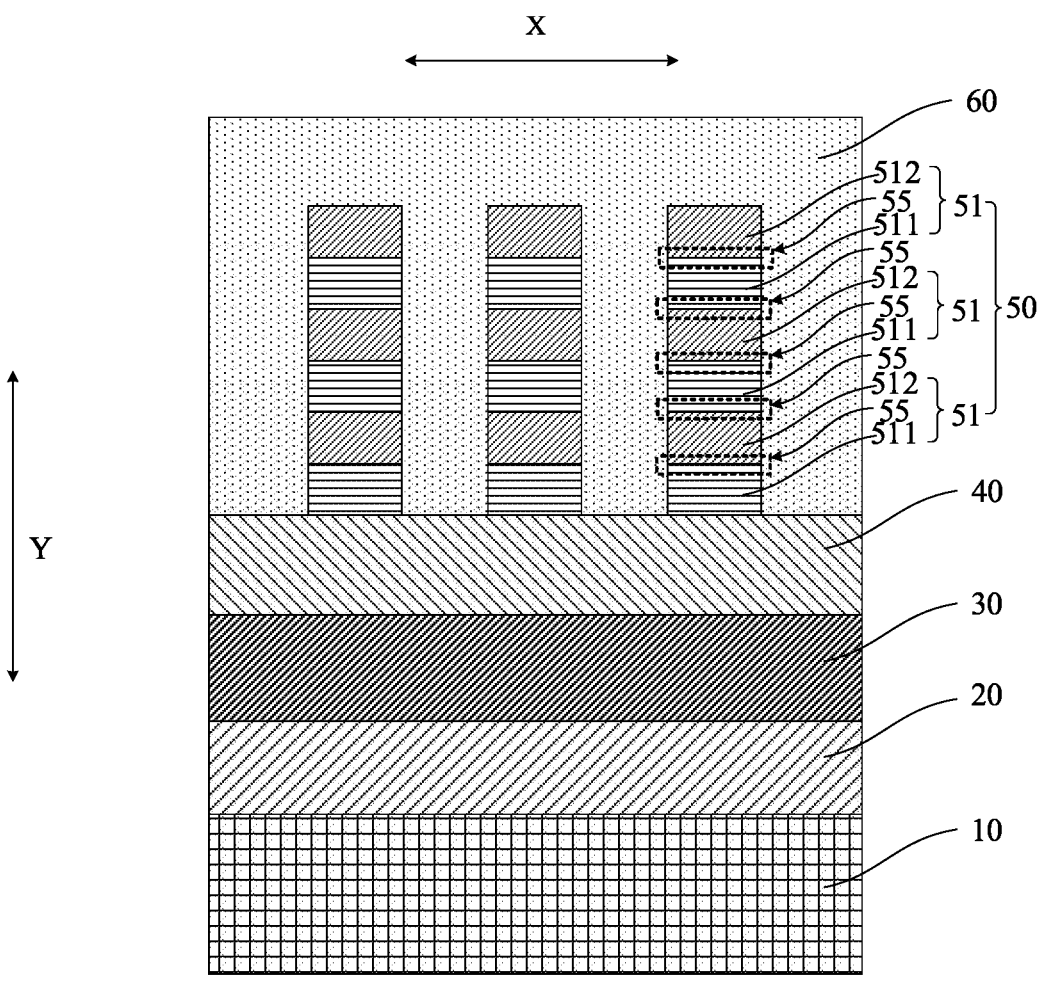
FIG. 2 is a schematic structural diagram illustrating another implementation of the semiconductor structure of the embodiment 1 of the present disclosure.
Figure 3A:
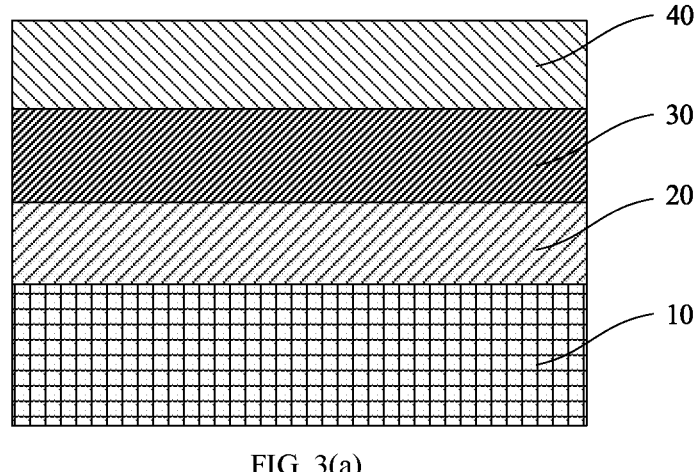
FIGS. 3(a) to 3(f) are process flowcharts illustrating a method for manufacturing the semiconductor structure of the embodiment 1 of the present disclosure.
Figure 3B:
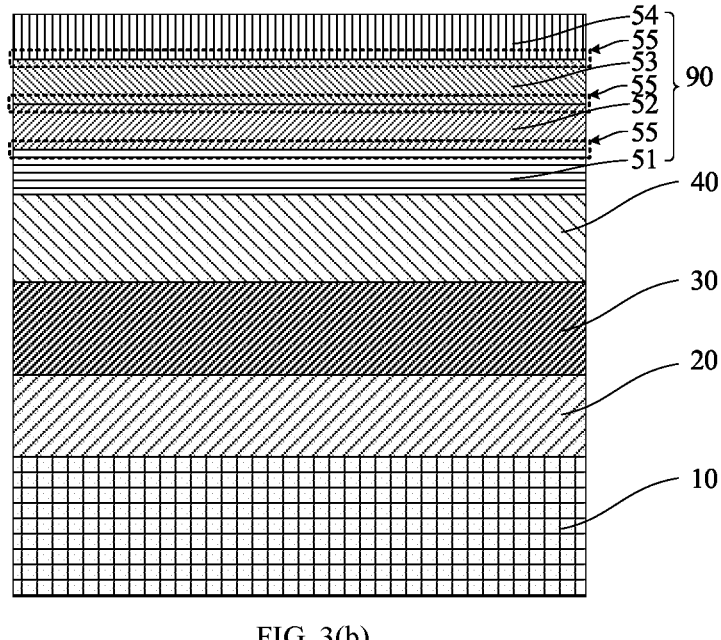
Figure 3C:
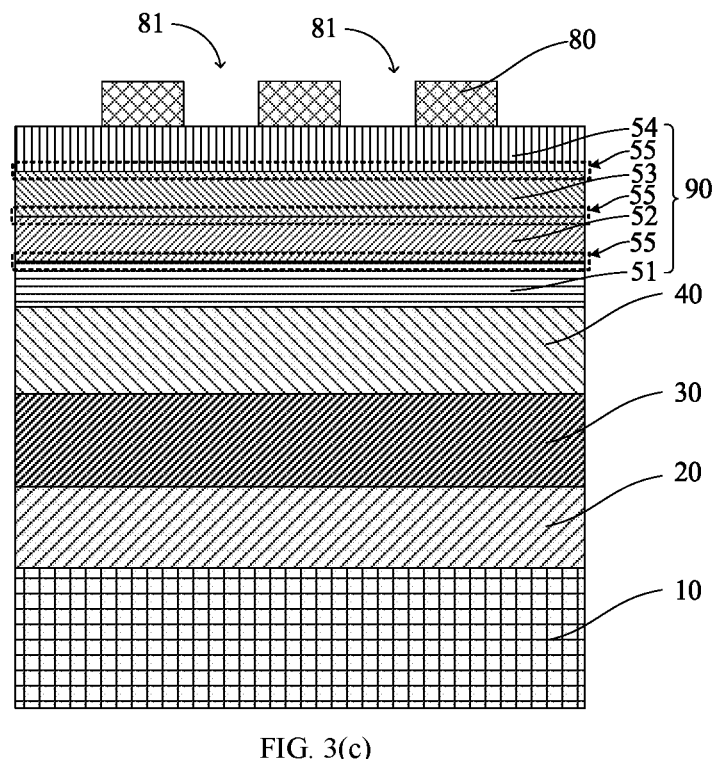
Figure 3D:
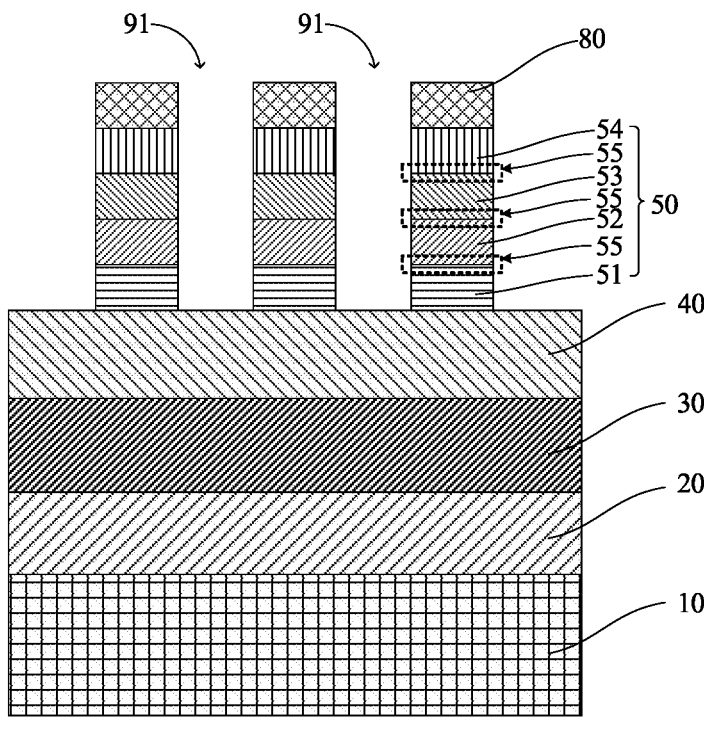
Figure 3E:
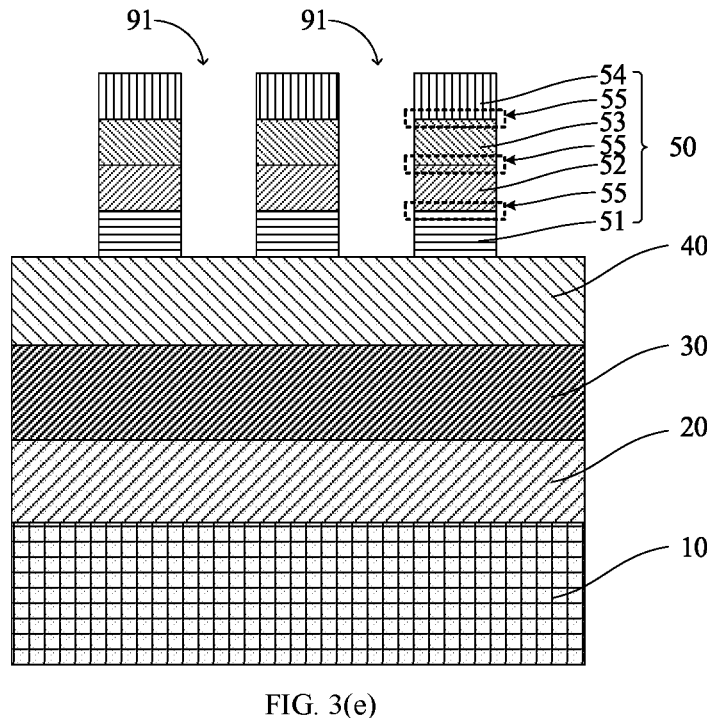
Figure 3F:
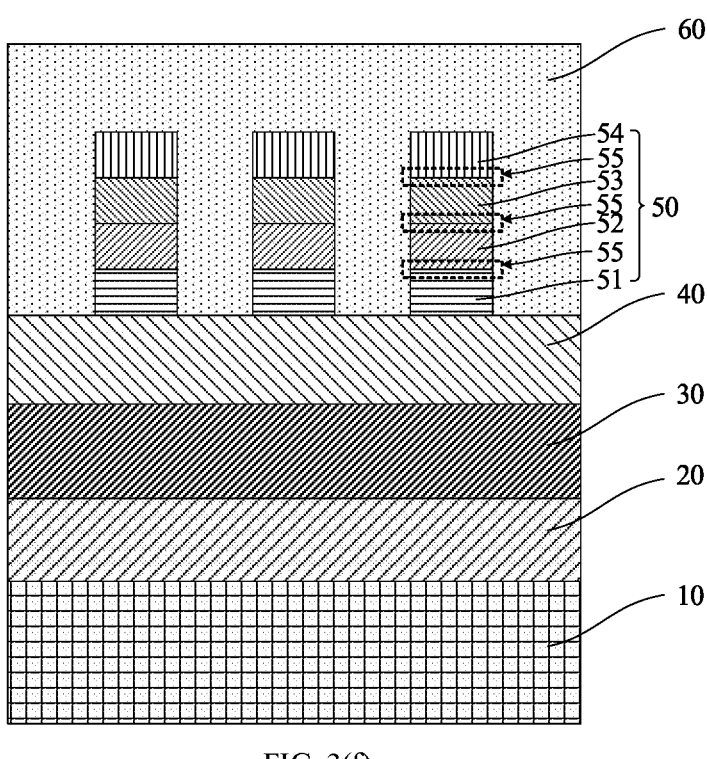

In another implementation of the present disclosure, as shown in FIG. 2, each semiconductor layer 51 includes a first semiconductor sub-layer 511 and a second semiconductor sub-layer 512 stacked along the vertical direction Y. A multiple-quantum-well unit 55 is formed between the first semiconductor sub-layer 511 and the second semiconductor sub-layer 512, wherein the first semiconductor sub-layer 511 includes indium. The molar content of indium in the first semiconductor sub-layer 511 of each semiconductor layer 51 increases sequentially in the direction of the N-type semiconductor layer 30 pointing toward the P-type semiconductor layer 60. That is, a semiconductor layer 51 close to the N-type semiconductor layer 30 is a short-wavelength biased multiple-quantum-well structure, and a semiconductor layer 51 close to the P-type semiconductor layer 60 is a long-wavelength biased multiple-quantum-well structure to form a multi-wavelength light emitting structure.

The material of the first semiconductor sub-layer 511 of the semiconductor layer 51 is InGaN, and the material of the second semiconductor sub-layer 512 of the semiconductor layer 51 is GaN. That is, the multiple-quantum-well structure 50 is a material structure with alternating stacks of InGaN material and GaN material.

As shown in FIGS. 3(*a*) to 3(*f*), another aspect of this embodiment also provides a method for manufacturing a semiconductor structure for manufacturing the above-mentioned semiconductor structure. The method includes the following steps.

At S100, an N-type semiconductor layer 30 is formed on the substrate 10 along the vertical direction Y to form an intermediate semiconductor structure.

At S200, at least one multiple-quantum-well structure 50 is formed on the intermediate semiconductor structure along a horizontal direction X, and each multiple-quantum-well structure 50 includes a plurality of semiconductor layers sequentially stacked along the vertical direction Y.

At S300, a P-type semiconductor layer 60 is formed above each of the multiple-quantum-well structures 50, and at least part of the sides of each of the multiple-quantum-well structures 50, and the P-type semiconductor layer 60 is in contact with each semiconductor layer of each of the multiple-quantum-well structures 50 along the vertical direction Y.

In step S100, specifically, as shown in FIG. 3(*a*), the following steps are included.

At S110, an intrinsic semiconductor layer 20 is formed on the substrate 10.

At S120, the N-type semiconductor layer 30 is formed on the intrinsic semiconductor layer 20.

At S130, a stress-release layer 40 is formed on the N-type semiconductor layer 30 to form an intermediate semiconductor structure.

In step S200, specifically, the following steps are included.

At S210: a multiple-quantum-well layer 90 is formed on the intermediate semiconductor structure as shown in FIG. 3(*b*). The multiple-quantum-well layer 90 includes a plurality of semiconductor layers sequentially stacked along the vertical direction Y, and a multiple-quantum-well unit formed between each two adjacent semiconductor layers of the plurality of semiconductor layers. Each of the plurality of semiconductor layers has a different molar content of indium, specifically, in this embodiment, the number of semiconductor layers is four, and the four semiconductor layers are recorded in order along the vertical direction Y as a first semiconductor layer 51, a second semiconductor layer 52, a third semiconductor layer 53 and a fourth semiconductor layer 54, where the first semiconductor layer 51, the second semiconductor layer 52, the third semiconductor layer 53 and the fourth semiconductor layer 54 have different the molar content of indium, but is not limited to, the number of semiconductor layers according to design requirements may be other values. Multiple-quantum-well units 55 are provided between the first semiconductor layer 51 and the second semiconductor layer 52, between the second semiconductor layer 52 and the third semiconductor layer 53, and between the third semiconductor layer 53 and the fourth semiconductor layer 54, respectively.

At S220, a mask 80 is formed on the multiple-quantum-well layer 90, and the mask 80 is patterned to form a hollow out region 81 on the mask 80, as shown in FIG. 3(*c*).

At S230, the multiple-quantum-well layer 90 is etched or corroded based on the patterned mask 80 as shown in FIG. 3(*d*), specifically, a plurality of first grooves 91 are formed on the multiple-quantum-well layer 90 by using external physical bombardment etching or chemical corroding at a depth (depth of the first grooves 91) of the lowermost semiconductor layer (the first semiconductor layer 51) to form at least one multiple-quantum-well structure 50. Optionally, the etching depth is equal to the thickness of the multiple-quantum-well layer 90 or less than the thickness of the multiple-quantum-well layer 90.

At S240, the mask 80 is removed as shown in FIG. 3(*e*).

Next, in step S300, as shown in FIG. 3(*f*), back to vapor phase epitaxy equipment, the P-type semiconductor layer 60 is formed above each of the multiple-quantum-well structures 50, and around the sides of each of the multiple-quantum-well structures 50, and the P-type semiconductor layer 60 is in contact with each semiconductor layer of each of the multiple-quantum-well structures 50 along the vertical direction Y, to complete the manufacture of the LED structure material with multiple light emitting wavelengths.

Embodiment 2

Figure 4:
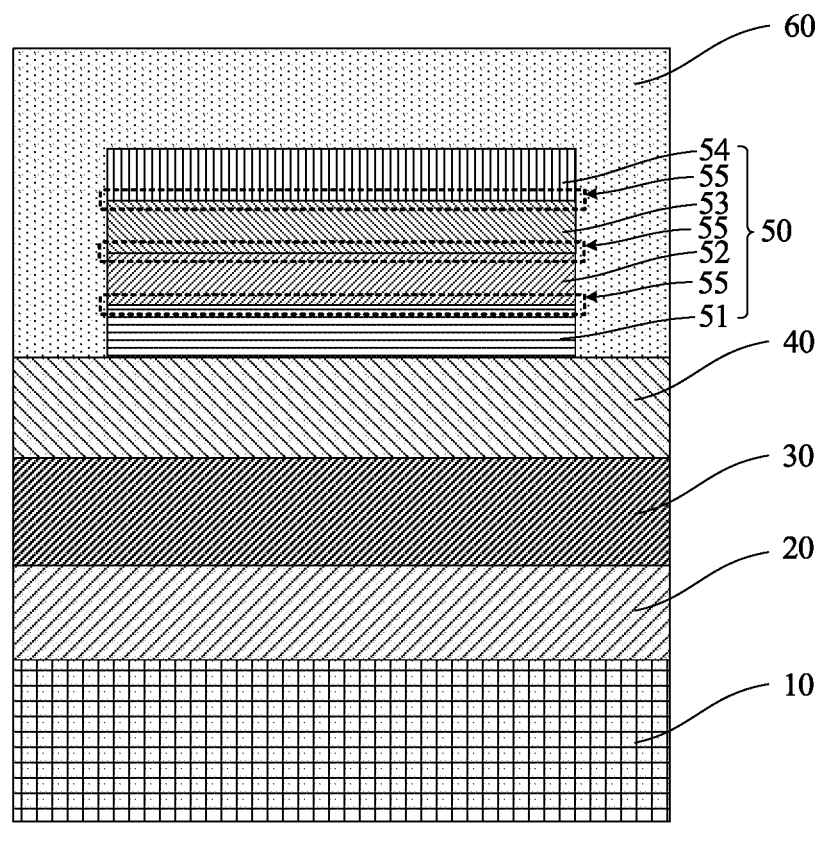
FIG. 4 is a schematic structural diagram illustrating a semiconductor structure according to an embodiment 2 of the present disclosure.
Figure 5A:
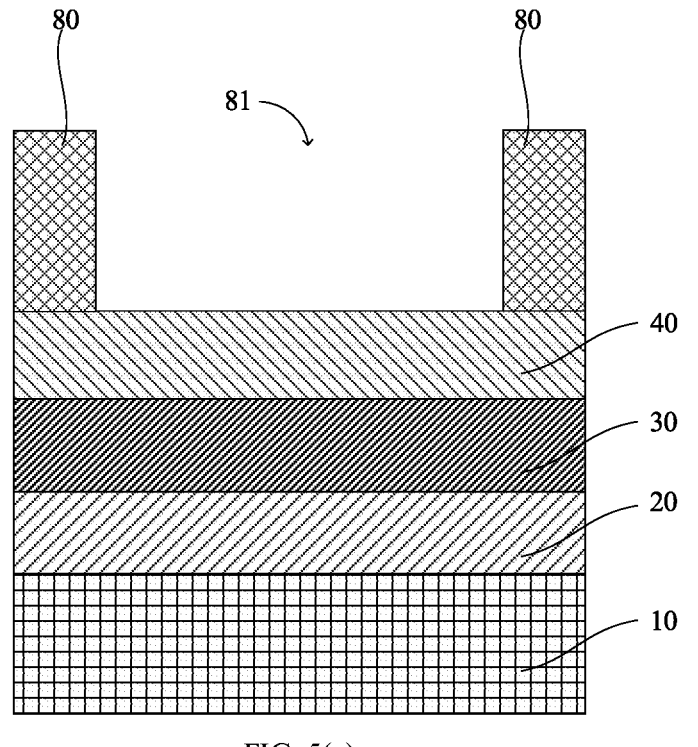
FIGS. 5(a) to 5(d) are process flowcharts illustrating a method for manufacturing the semiconductor structure of the embodiment 2 of the present disclosure.
Figure 5B:
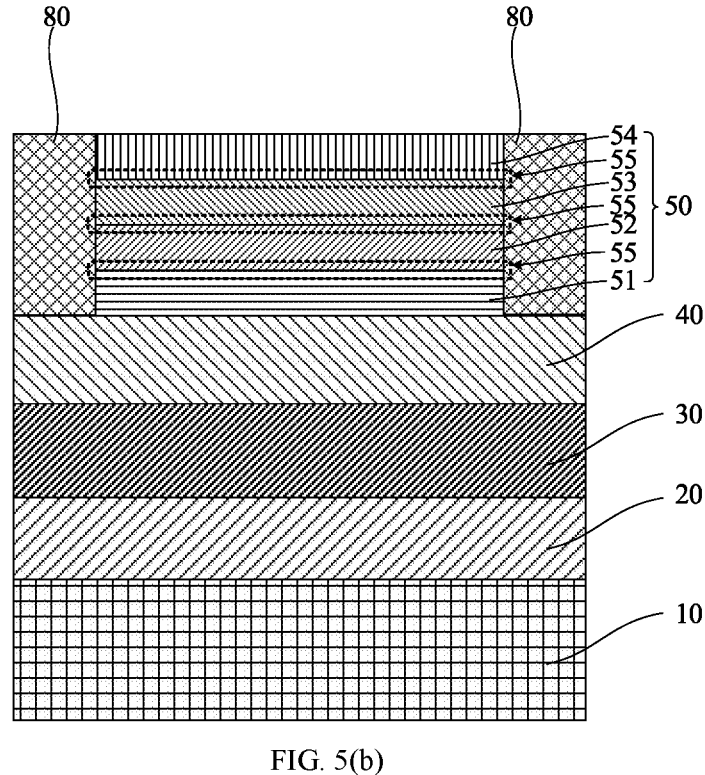
Figure 5C:
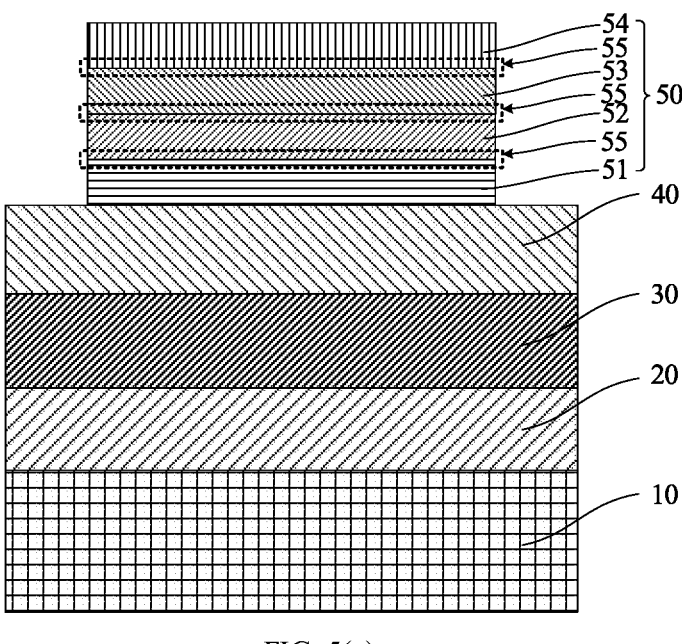
Figure 5D:
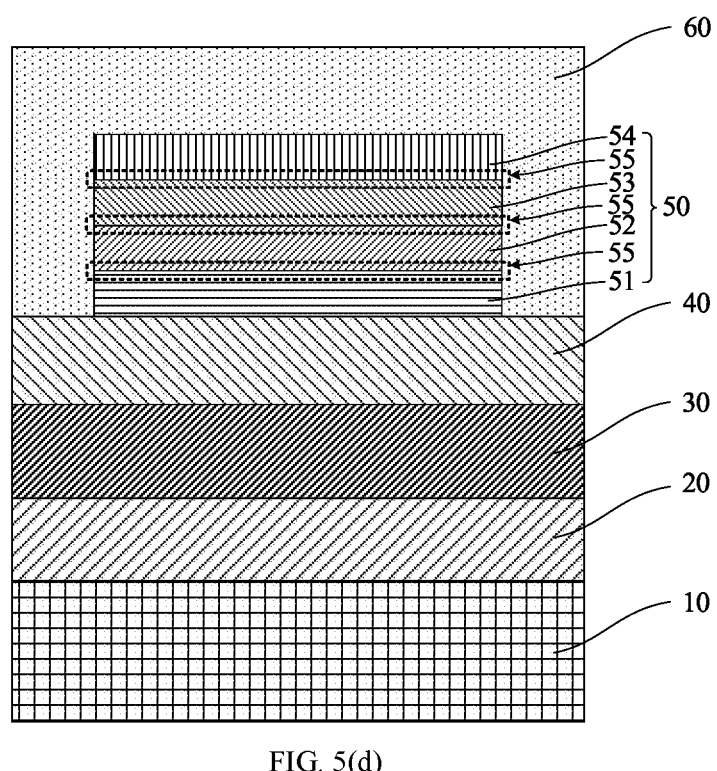

As shown in FIG. 4, this embodiment also provides a semiconductor structure that has substantially the same structure as the semiconductor structure in the embodiment 1, the difference is that, in the embodiment 2, the number of multiple-quantum-well structure 50 is one, and the P-type semiconductor layer 60 is disposed above the multiple-quantum-well structure 50, and around the sides of the multiple-quantum-well structure 50.

As shown in FIGS. 5(*a*) to 5(*d*), another aspect of this embodiment also provides a method for manufacturing a semiconductor structure for manufacturing the above-mentioned semiconductor structure. The method is substantially the same as the method of the embodiment 1, the difference is as follows.

The step S200 includes the following steps.

At S210, a mask 80 is formed on the intermediate semiconductor structure, and the mask 80 is patterned to form a hollow out region 81 on the mask 80, as shown in FIG. 5(*a*).

At S220, a multiple-quantum-well structure 50 is formed in the hollow out region 81 of the mask 80 as shown in FIG. 5(*b*).

At S230, the mask 80 is removed as shown in FIG. 5(*c*).

Next, in the step S300, as shown in FIG. 5(*d*), the P-type semiconductor layer 60 is formed above the multiple-quantum-well structure 50, and around the sides of the multiple-quantum-well structure 50, and the P-type semiconductor layer 60 is in contact with each semiconductor layer of each multiple-quantum-well structure 50 along the vertical direction Y, to complete the manufacture of the LED structure material with multiple light emitting wavelengths.

It is noted that the method in this embodiment is also adapted to manufacture the semiconductor structure in the embodiment 1.

Embodiment 3

Figure 6:
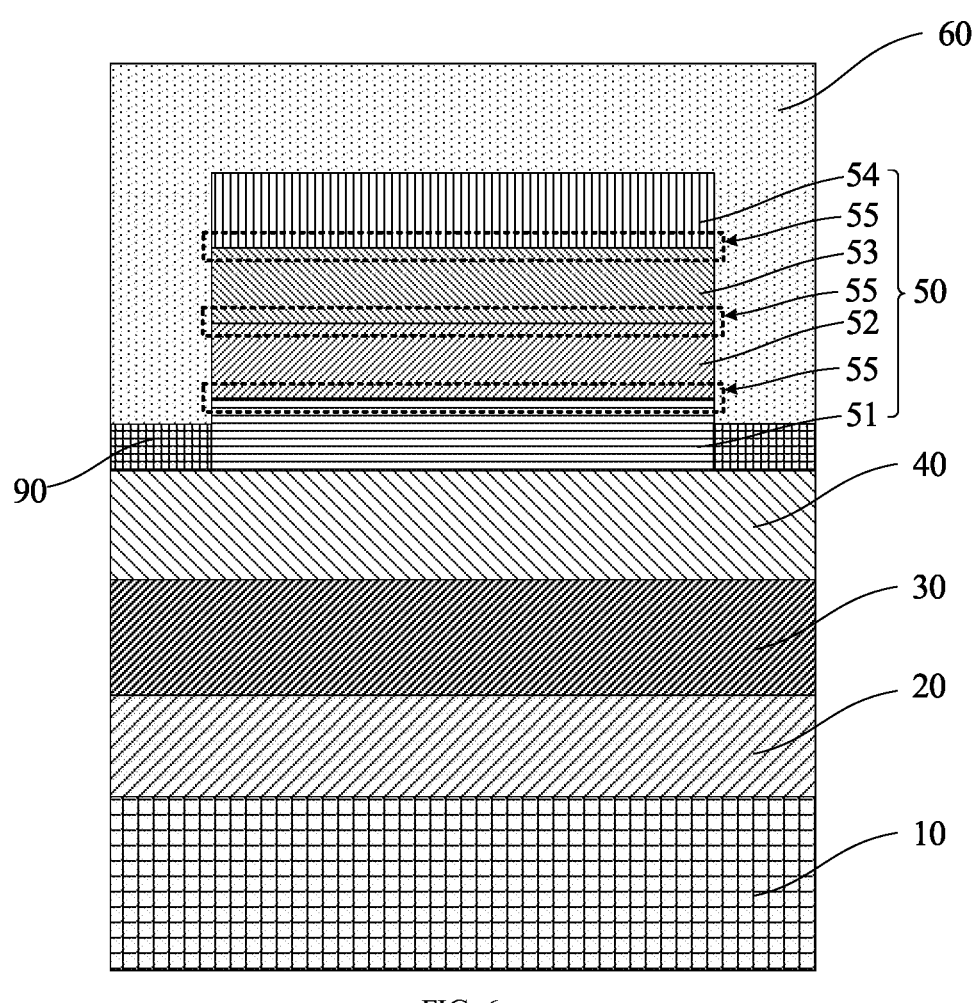
FIG. 6 is a schematic structural diagram illustrating a semiconductor structure according to an embodiment 3 of the present disclosure.

As shown in FIG. 6, this embodiment also provides a semiconductor structure that has substantially the same structure as the semiconductor structure in the embodiment 2, the difference is as follows.

The semiconductor structure further includes a dielectric layer 90, the dielectric layer 90 is disposed between the N-type semiconductor layer 30 and the P-type semiconductor layer 60, the dielectric layer 90 is formed with a hollow out region, and the multiple-quantum-well structure 50 is formed in the hollow out region. The dielectric layer 90 is used to isolate the recombination of carriers between the N-type semiconductor layer 30 and the P-type semiconductor layer 60, thereby a reduction in the luminescence efficiency of the device is avoided. The material of the dielectric layer 90 is silicon nitride.

Figures 7A, 7B:
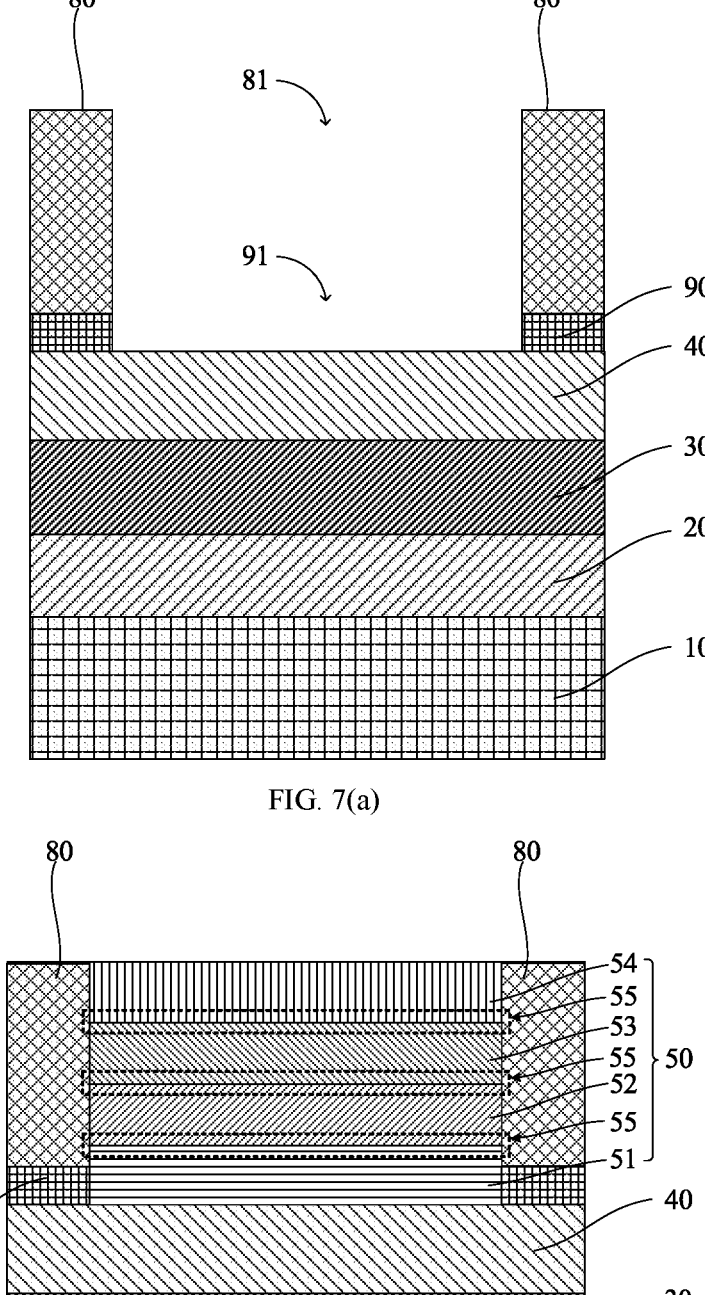
FIGS. 7(a) to 7(d) are process flowcharts illustrating a method for manufacturing the semiconductor structure of the embodiment 3 of the present disclosure.

As shown in FIGS. 7(*a*) to 7(*d*), another aspect of this embodiment also provides a method for manufacturing a semiconductor structure for manufacturing the above-mentioned semiconductor structure. The method is substantially the same as the method of the embodiment 2, the difference is as follows.

The step S200 includes the following steps.

At S210, as shown in FIG. 7(*a*), a dielectric layer 90 and a mask 80 are formed to stack on the intermediate semiconductor structure, and the dielectric layer 90 and the mask 80 are patterned to form a hollow out region 81 in the mask 80 and a hollow out region 91 in the dielectric layer 90.

At S220, as shown in FIG. 7(*b*), a multiple-quantum-well structure 50 is formed in the hollow out region 81 of the mask 80 and the hollow out region 91 of the dielectric layer 9       10

90, where the hollow out region 81 of the mask 80 is formed corresponding to the hollow out region 91 of the dielectric layer 90.

Figure 7C:
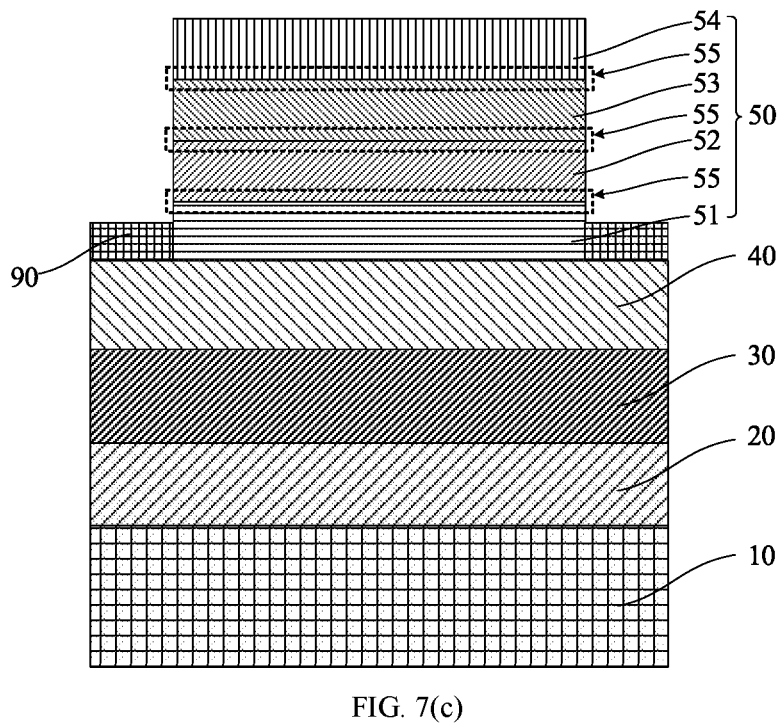

At S230, the mask 80 is removed as shown in FIG. 7(c).

Figure 7D:
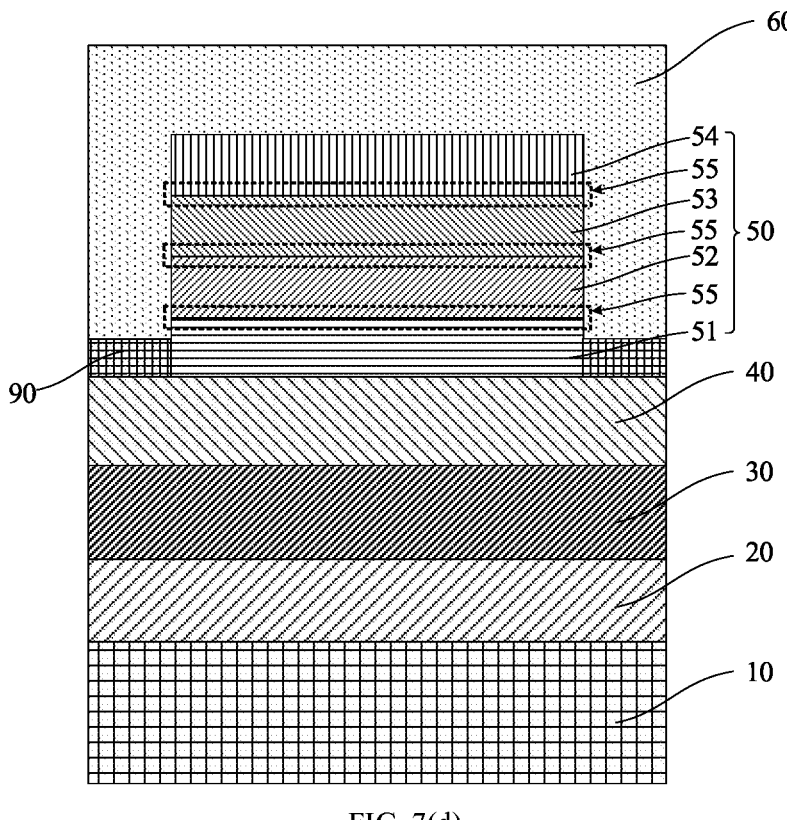

Next, in the step S300, as shown in FIG. 7(d), the P-type semiconductor layer 60 is formed above the dielectric layer 90, above the multiple-quantum-well structure 50, and around the sides of the multiple-quantum-well structures 50, and the P-type semiconductor layer 60 is in contact with each semiconductor layer of each of the multiple-quantum-well structures 50 along the vertical direction Y to complete the manufacture of the LED structure material with multiple light-emitting wavelengths.

In this embodiment, the number of multiple-quantum-well structures 50 is one, but is not limited to thereto, and the number of multiple-quantum-well structures 50 can also be set to two or other numbers according to the design requirements.

It is noted that the method in this embodiment is also adapted to manufacture the semiconductor structure in the embodiment 1.

Embodiment 4

Figure 8:
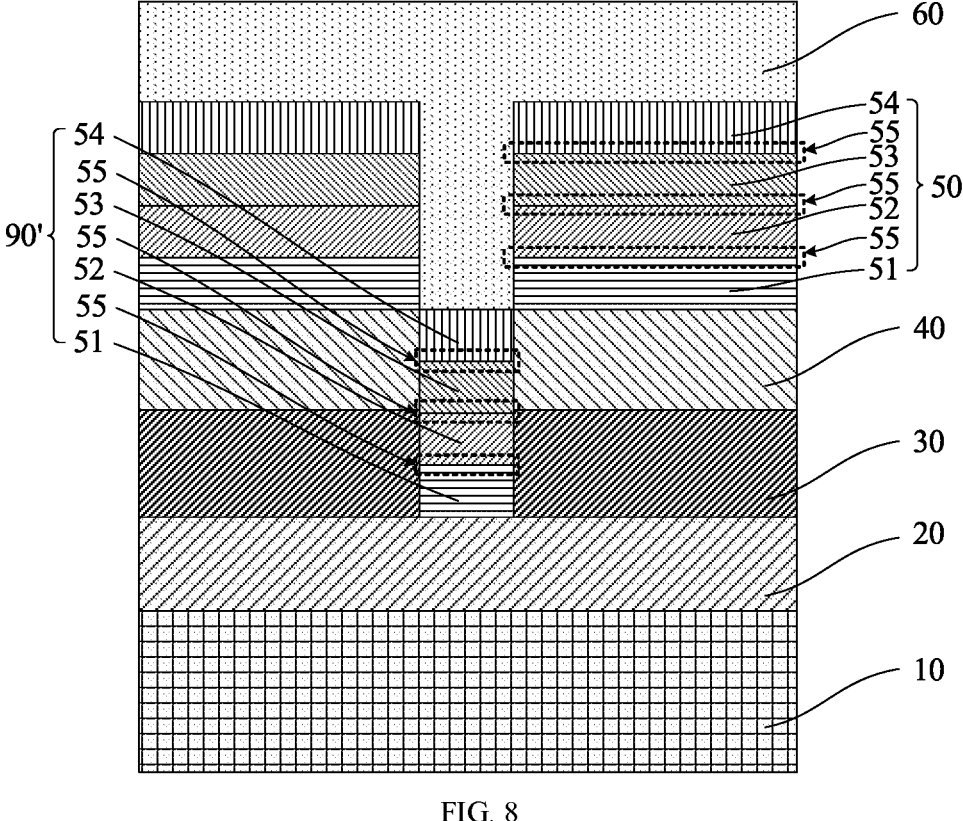
FIG. 8 is a schematic structural diagram illustrating a semiconductor structure according to an embodiment 4 of the present disclosure.

As shown in FIG. 8, this embodiment also provides a semiconductor structure that has substantially the same structure as the semiconductor structure in the embodiment 1, the difference is that the multiple-quantum-well structures 50 is plural in number, and the plurality of multiple-quantum-well structures 50 are spaced apart when the outer side of the outermost multiple-quantum-well structure 50 is flush with the outer side of the N-type semiconductor layer 30 below, and the multiple multiple-quantum-well structures 50 are spaced apart, and the P-type semiconductor layer 60 is disposed above all of the multiple-quantum-well structures 50, and between each two adjacent multiple-quantum-well structures 50; and the N-type semiconductor layer 30 is provided with a groove 70 through the N-type semiconductor layer 30, and a multiple-quantum-well structure 90' is formed in the groove 70.

Where the number of multiple-quantum-well structures 50 in this embodiment is two, but is not limited thereto.

As shown in FIGS. 9(a) to 9(d), another aspect of this embodiment also provides a method for manufacturing a semiconductor structure for manufacturing the above-mentioned semiconductor structure. The method is substantially the same as the method of the embodiment 1, the difference is as follows.

The step S200 includes the following steps.

At S210, a groove 70 is formed in the intermediate semiconductor structure.

At S220, a multiple-quantum-well structure 50 is formed on the intermediate semiconductor structure, and a multiple-quantum-well structure 90' is also formed in the groove 70.

Figure 9A:
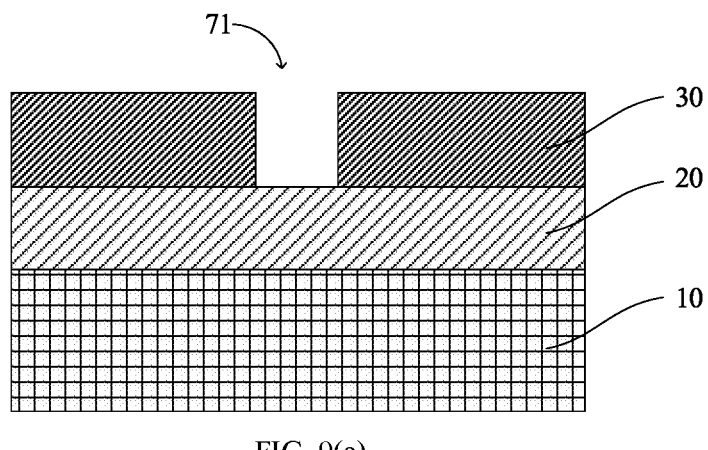
FIGS. 9(a) to 9(d) are process flowcharts illustrating a method for manufacturing the semiconductor structure of the embodiment 4 of the present disclosure.
Figure 9B:
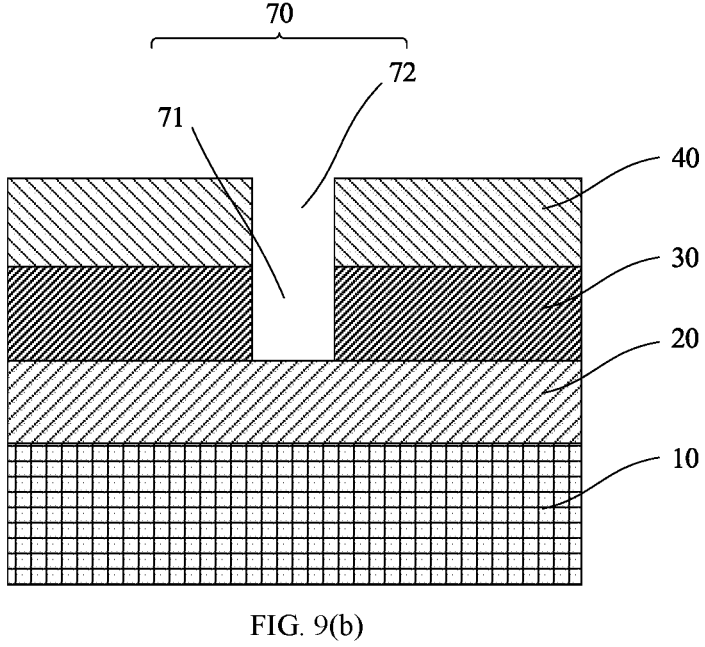

In the step S210, a second groove 71 may be formed by etching the N-type semiconductor layer 30 after the N-type semiconductor layer 30 of the intermediate semiconductor structure is formed as shown in FIG. 9(a), and as shown in FIG. 9(b), a stress-release layer 40 is formed on the unetched N-type semiconductor layer 30, and a third groove 72 is formed above the second groove 71 on the same layer as the N-type semiconductor layer 30, so that the final groove 70 is formed by stacking the second groove 71 and the third groove 72. The groove 70 can also be formed directly on the final formed intermediate semiconductor structure by etching.

Figure 9C:
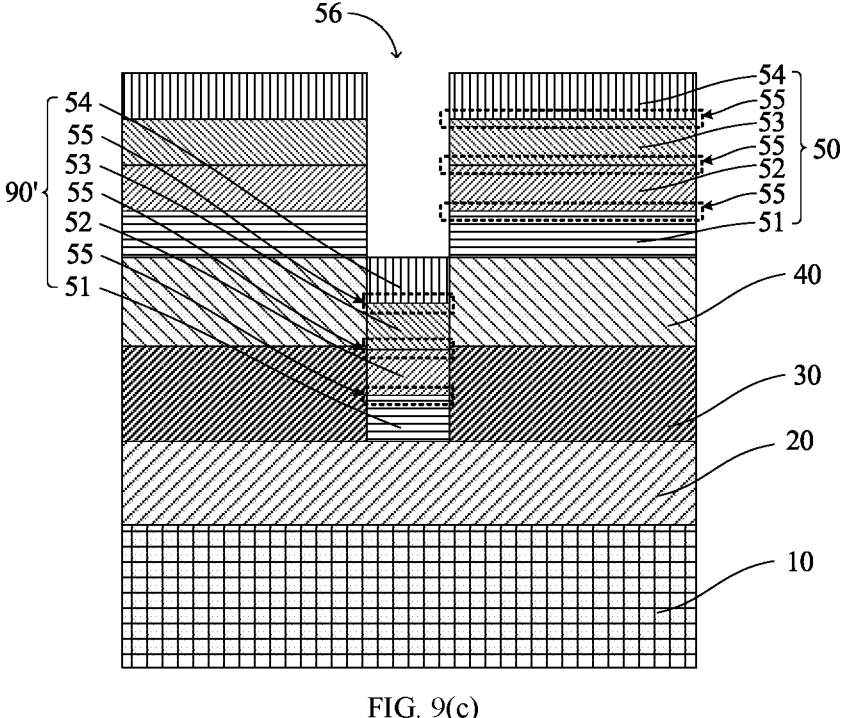

In step S220, as shown in FIG. 9(c), since the groove 70 is formed on the intermediate semiconductor structure, in successive formation of the multiple-quantum-well structure, the multiple-quantum-well layer located on the intermediate semiconductor structure naturally forms a multiple-quantum-well structure 50 with a spacer 56 therein, and a multiple-quantum-well structure 90' is also formed in the groove 70. The multiple-quantum-well structure 90' formed in the groove 70 can prevent the carriers of the P-type semiconductor layer 60 from being directly injected into the N-type semiconductor layer 30.

Figure 9D:
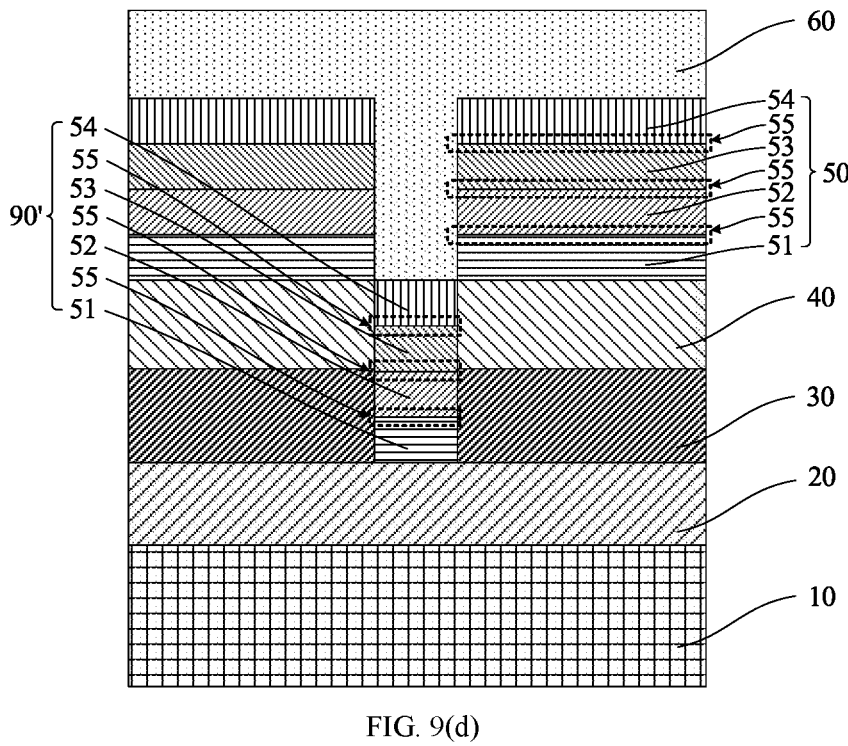

In step 300, as shown in FIG. 9(d), since the outer side of the outermost multiple-quantum-well structure 50 is flush with the outer side of the underlying N-type semiconductor layer 30, the P-type semiconductor layer 60 is disposed above all the multiple-quantum-well structures 50 and between the two adjacent multiple-quantum-well structures 50.

It is noted that the method in this embodiment is also adapted to manufacture the semiconductor structures in the embodiment 1 as well as the embodiment 2.

Embodiment 5

Figure 10:
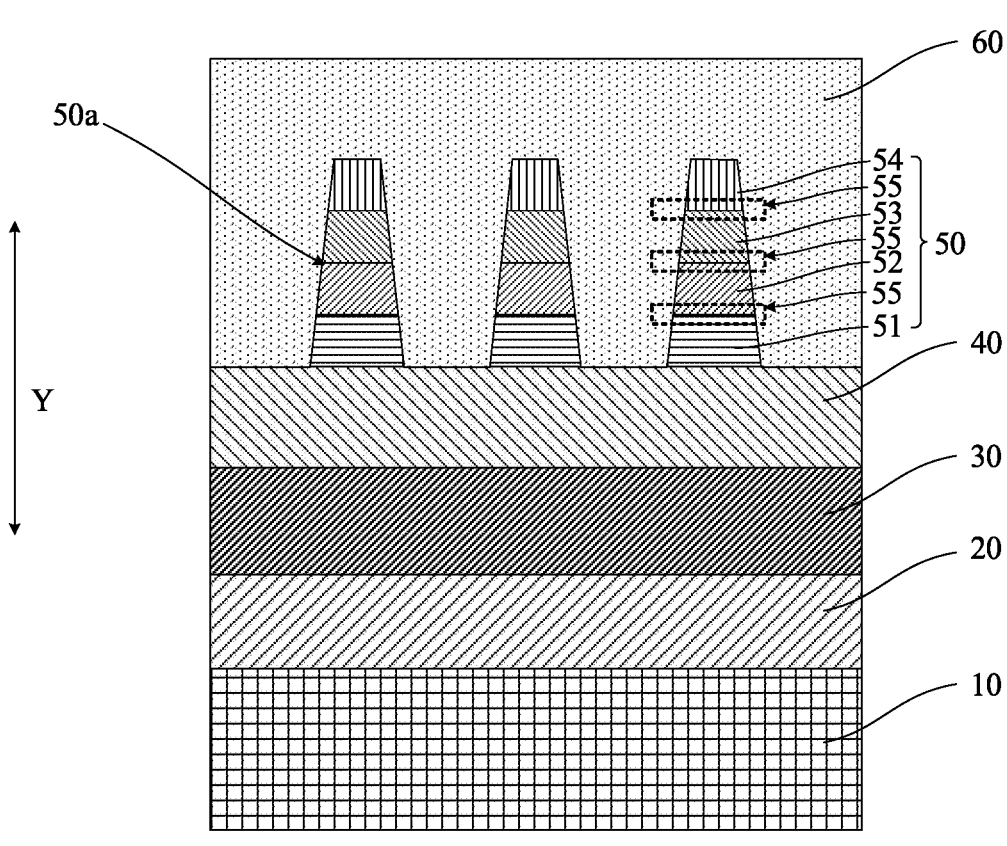
FIG. 10 is a schematic structural diagram illustrating a semiconductor structure according to an embodiment 5 of the present disclosure.

As shown in FIG. 10, this embodiment also provides a semiconductor structure that has substantially the same structure as the semiconductor structure in the embodiment 1, the difference is as follows.

The sides of the multiple-quantum-well structures 50 extend obliquely inward along the direction of the N-type semiconductor layer 30 pointing toward the P-type semiconductor layer 60, i.e., the sides are oblique. For example, the cross sections of the multiple-quantum-well structures 50 forms a trapezoidal shape as shown in FIG. 10.

Figure 11:
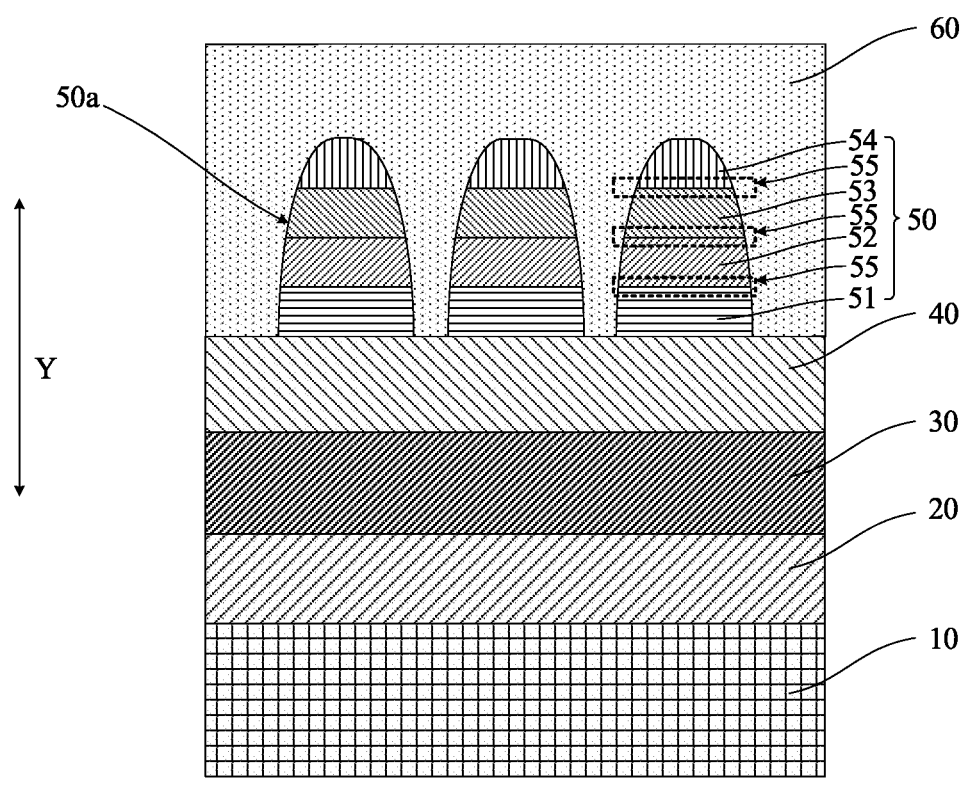
FIG. 11 is a schematic structural diagram illustrating another implementation of the semiconductor structure of the embodiment 5 of the present disclosure.

In an alternative embodiment, the sides 50a of the multiple-quantum-well structures 50 are curved, as shown in FIG. 11.

The foregoing is only some embodiments of the present disclosure and is not intended to limit the present disclosure, and any modifications, equivalent replacements, improvements, etc. made within the spirit and principles of the present disclosure shall be included within the scope of the present disclosure.

The invention claimed is:

1. A semiconductor structure, comprising:

a substrate;

an N-type semiconductor layer on the substrate;

a multiple-quantum-well structure provided on the N-type semiconductor layer, wherein the multiple-quantum-well structure comprises a plurality of semiconductor layers sequentially stacked and a multiple-quantum-well unit formed between each two adjacent semiconductor layers of the plurality of semiconductor layers; wherein for each of the plurality of semiconductor layers of the multiple-quantum-well structure, the semiconductor layer comprises a first semiconductor sub-layer and a second semiconductor sub-layer periodically stacked, and the multiple-quantum-well unit is between the first semiconductor sub-layer and the second semiconductor sub-layer; wherein the first semiconductor sub-layer comprises indium, and the indium in the first semiconductor sub-layer of each of the plurality of semiconductor layers of the multiple-quantum-well structure has a different molar content of indium; and a P-type semiconductor layer on the multiple-quantum-well structure and on at least part of sides of the multiple-quantum-well structure, wherein the P-type semiconductor layer is in contact with each of the plurality of semiconductor layers of the multiple-quantum-well structure.

2. The semiconductor structure of claim 1, wherein the N-type semiconductor layer is provided with a groove penetrating through the N-type semiconductor layer, and a multiple-quantum-well structure is formed in the groove.

3. The semiconductor structure of claim 1, wherein the multiple-quantum-well structures is singular or plural in number, when the multiple-quantum-well structures is plural in number, a plurality of multiple-quantum-well structures are regularly or irregularly arranged along a horizontal direction.

4. The semiconductor structure of claim 1, wherein a molar content of indium in the first semiconductor sub-layers of the plurality of semiconductor layers increases sequentially along a direction of the N-type semiconductor layer pointing toward the P-type semiconductor layer.

5. The semiconductor structure of claim 4, wherein materials of the first semiconductor sub-layers of the plurality of semiconductor layers comprise InGaN, and materials of the second semiconductor sub-layers of the plurality of semiconductor layers comprise GaN;

a material of the N-type semiconductor layer comprises a group III nitride;

a material of the P-type semiconductor layer comprises a group Ill nitride.

6. The semiconductor structure of claim 1, further comprising:

an intrinsic semiconductor layer between the substrate and the N-type semiconductor layer.

7. The semiconductor structure of claim 1, further comprising:

a stress-release layer between the N-type semiconductor layer and the multiple-quantum-well structure.

8. The semiconductor structure of claim 7, wherein a material of the stress-release layer comprises at least one of GaN or InGaN.

9. The semiconductor structure of claim 1, further comprising a dielectric layer between the N-type semiconductor layer and the P-type semiconductor layer, the dielectric layer is formed with a hollow out region, and the multiple-quantum-well structure is formed in the hollow out region.

10. The semiconductor structure of claim 1, wherein the sides of the multiple-quantum-well structure extend obliquely inward along the direction of the N-type semiconductor layer pointing toward the P-type semiconductor layer, and the sides are oblique or curved.

11. The semiconductor structure of claim 1, wherein each of the plurality of semiconductor layers of the multiple-quantum-well structure emits light at a different emission wavelength, wherein the semiconductor layer closest to the N-type semiconductor layer has the shortest emission wavelength, and the semiconductor layer farthest from the N-type semiconductor layer has the longest emission wavelength.

12. A method for manufacturing a semiconductor structure, comprising:

S1: forming an N-type semiconductor layer on a substrate in a vertical direction to form an intermediate semiconductor structure;

S2: forming a multiple-quantum-well structure on the intermediate semiconductor structure, wherein the multiple-quantum-well structure comprises a plurality of semiconductor layers sequentially stacked and a multiple-quantum-well unit formed between each two adjacent semiconductor layers of the plurality of semiconductor layers; wherein for each of the plurality of semiconductor layers of the multiple-quantum-well structure, the semiconductor layer comprises a first semiconductor sub-layer and a second semiconductor sub-layer periodically stacked, and the multiple-quantum-well unit is between the first semiconductor sub-layer and the second semiconductor sub-layer; wherein the first semiconductor sub-layer comprises indium, and the indium in the first semiconductor sub-layer of each of the plurality of semiconductor layers of the multiple-quantum-well structure has a different molar content of indium; and S3: forming a P-type semiconductor layer on the multiple-quantum-well structure and on at least part of sides of the multiple-quantum-well structure, wherein the P-type semiconductor layer is in contact with each of the plurality of semiconductor layers of the multiple-quantum-well structure in the vertical direction.

13. The method of claim 12, wherein the step S2 comprises:

S21: forming a multiple-quantum-well layer on the intermediate semiconductor structure;

S22: forming a mask on the multiple-quantum-well layer;

S23: etching or corroding the multiple-quantum-well layer through the mask to form the multiple-quantum-well structure; and S24: removing the mask.

14. The method of claim 12, wherein the step S2 comprises:

S21: forming a mask on the intermediate semiconductor structure;

S22: forming the multiple-quantum-well structure in a hollow out region of the mask; and S23: removing the mask.

15. The method of claim 12, wherein the step S2 comprises:

S21: forming a dielectric layer and a mask stacked on the intermediate semiconductor structure;

S22: forming the multiple-quantum-well structure in a hollow out region of the mask and in a hollow out region of the dielectric layer, and the hollow out region of the mask is formed corresponding to the hollow out region of the dielectric layer; and S23: removing the mask.

16. The method of claim 12, wherein the step S2 comprises:

S21: forming a groove on the intermediate semiconductor structure; and

S22: forming a multiple-quantum-well structure on the intermediate semiconductor structure and in the groove.

17. The method of claim 12, wherein the step S1 comprises:

S11: forming an intrinsic semiconductor layer on the substrate;

S12: forming the N-type semiconductor layer on the intrinsic semiconductor layer; and S13: forming a stress-release layer on the N-type semiconductor layer to form the intermediate semiconductor structure.

18. The method of claim 13, wherein a depth of etching or corroding of the multiple-quantum-well layer in the step S23 is equal to or less than a thickness of the multiple-quantum-well layer.

* * * * *